United States Patent [19]

MacDiarmid et al.

[11] Patent Number: 4,459,163
[45] Date of Patent: Jul. 10, 1984

[54] AMORPHOUS SEMICONDUCTOR METHOD

[75] Inventors: Alan G. MacDiarmid, Philadelphia, Pa.; Zoltan J. Kiss, Belle Mead, N.J.

[73] Assignee: Chronar Corporation, Princeton, N.J.

[21] Appl. No.: 353,097

[22] Filed: Mar. 5, 1982

Related U.S. Application Data

[63] Continuation-in-part of Ser. No. 242,707, Mar. 11, 1981, abandoned.

[51] Int. Cl.³ .................... C01B 33/02; H01L 31/18
[52] U.S. Cl. .................... 148/174; 423/349; 427/74; 427/86; 136/258; 357/2; 357/30
[58] Field of Search .......... 423/349; 427/74, 85–87, 427/95, 248.1; 148/174; 136/258 AM; 357/2, 30

[56] References Cited

U.S. PATENT DOCUMENTS 4,237,150 12/1980 Wiesman ..................... 427/74
4,237,151 12/1980 Strongin et al. ............ 427/74
4,357,179 11/1982 Adams et al. ............... 148/1.5

OTHER PUBLICATIONS

R. M. Plecenik et al., "Preparation of Amorphous Hydrogenated Silicon by Chemical Vapor Deposition", IBM Tech. Disc. Bull; vol. 24, 1523–1524 (1981).

Primary Examiner—Aaron Weisstuch
Attorney, Agent, or Firm—George E. Kersey

[57] ABSTRACT

Preparation of amorphous semiconductor material that is suitable for use in a wide variety of devices by the pyrolytic decomposition of one or more gaseous phase polysemiconductanes, including polysilanes and polygermanes.

8 Claims, 11 Drawing Figures

AMORPHOUS SEMICONDUCTOR METHOD

BACKGROUND OF THE INVENTION

The invention relates to the production of amorphous semiconductors, particularly for use in semiconductive devices.

This is a continuation-in-part of Ser. No. 242,707 filed Mar. 11, 1981, now abandoned.

Amorphous semiconductors are useful in a wide variety of devices. Examples include memories, field effect and thin film devices, displays and luminescent devices.

Amorphous semiconductors are particularly useful for photovoltaic devices which provide a voltage when subjected to radiation, or radiate when electrically energized. Unfortunately, photovoltaic devices are not presently competitive with conventional sources of electrical energy. This has been caused primarily by the cost of manufacturing suitable semiconductive materials. Initially, expensive and relatively thick single crystal material was required. More recently, amorphous material with suitable photosensitivity has been fabricated by glow discharge in a gaseous atmosphere.

Amorphous material in the form of hydrogenated silicon prepared by glow discharge has proved to be particularly suitable. Illustrations are found in U.S. Pat. Nos. 4,064,521; 4,142,195; 4,163,677; 4,196,438; 4,200,473 and 4,162,505.

Although the glow discharge manufacture of amorphous silicon is less costly than the production of single crystal material, cost considerations continue to limit the general employment of this technique.

One attempt to provide a lower cost material has involved the production of amorphous silicon by the pyrolytic decomposition of monosilane ($SiH_4$). Other techniques employed with monosilanes have included sputtering and vacuum evaporation.

Unfortunately, the amorphous silicon produced by the pyrolytic decomposition of monosilane, commonly known as "chemical vapor deposition" (CVD) has shown limited photovoltaic or photoconductive behavior. This has continued to be the case even when the material is hydrogenated to compensate for what has been regarded as a defect density in the material.

Similarly, amorphous silicons prepared by sputtering and vacuum evaporation of monosilanes have exhibited less photoresponse than that provided by glow discharge materials.

Other attempts have been made to produce amorphous silicon from various fluorosilanes as described, for example, in U.S. Pat. Nos. 3,120,451 and 4,125,643. Here again, while the photoresponsive properties of the resultant materials have been similar to those associated with hydrogenated amorphous silicon produced by glow discharge, the costs of the process are still considerable.

Another method of preparing amorphous silicon is by the decomposition of silanes at a comparatively high temperature (1400° C. to 1600° C.) in a high vacuum reactor required to be held at pressure below $10^{-4}$ Torr. The resulting gas stream is then directed onto a substrate held at a lower temperature as set forth in U.S. Pat. Nos. 4,237,150 and 4,237,151. This technique is cumbersome, requires the use of high temperatures and high vacuums, and leads to films with rather low photoconductivities ($10^{-7}$ ($\Omega$-cm)$^{-1}$ or lower.)

Accordingly, it is an object of the invention to achieve the efficient and low cost production of semiconductive materials with suitable photoresponsive properties. A related object is to achieve suitable photovoltaic and photodetecting devices.

Another object of the invention is to provide for the production of semiconductive material with suitable photosensitivity with less cost and complexity than for single crystal materials.

A further object of the invention is to achieve amorphous silicon material at less cost and with less complexity than for glow discharge, sputtering and vacuum evaporation techniques.

SUMMARY OF THE INVENTION

In accomplishing the foregoing and related objects, the invention provides a method of preparing an amorphous semiconductor with suitable photosensitivity by the pyrolytic decomposition of one or more gaseous phase polysemiconductanes at a temperature below about 500° C. This technique is to be distinguished from the prior art pyrolytic decomposition of silanes and fluorosilanes in which significantly lower photoconductivity and inferior photovoltaic properties have resulted. This procedure lends itself to continuous processing as opposed to batch processing, and eliminates the costly and complex equipment associated with the production of single crystals and amorphous silicon by glow discharge, sputtering and vacuum evaporation.

In accordance with one aspect of the invention, the decomposition takes place at a temperature in the range from about 300° C. to about 500° C. and is preferably in the range from about 350° C. to 450° C.

In accordance with another aspect of the invention, the decompositon takes place at a partial pressure of polysilane less than about one atmosphere and above about one micron of mercury, and preferably above about one Torr. A Torr is a unit of pressure equal to 1.333 millibars and one thousand microns of mercury at standard gravity and 0° Centigrade. The pressure is desirably in the range from about one Torr to about 100 Torr in order to limit the gas phase nucleation of particles during pyrolytic decomposition. Gas phase nucleation is a showering of particles which leads to a mixture of amorphous and crystal materials.

In accordance with a further aspect of the invention, the polysemiconductanes are selected from the class ranging from disemiconductanes to and including hexasemiconductanes, represented by the formula $Sc_nH_{2n+2}$, where "Sc" refers to a semiconductor, such as silicon or germanium and n ranges from two to six. The polysemiconductanes are desirably obtained from the reaction product of a semiconductide, such as magnesium silicide ($Mg_2Si$) with a aqueous acid, such as phosphoric acid ($H_3PO_4$), aqueous strong sulfuric acid ($H_2SO_4$), hydrogen fluoride (HF) and hydrogen chloride (HCl). The semiconductanes of an order higher than disemiconductanes are separated by first passing the gaseous materials from the reaction chamber through a trap which is cooled by a mixture of solid and liquid toluene (−96° C. ) which removes water and polysilanes of order higher than two. The resulting gaseous mixture is then passed through a trap cooled by a mixture of liquid and solid n-pentane (−136° C.) which removes disilane. The gases which are not condensed in the trap (namely monosilane and hydrogen) are discarded. If higher purity disilane is desired, the disilane that has been trapped may be further purified by multiple traps to trap distillations, by low temperature fractionation, or by other procedures, such as gas chromatography, etc.

The polysemiconductanes may also be prepared by reduction of semiconductor halides, such as disilicon hexachloride with a hydride such as lithium aluminum hydride.

In accordance with a still further aspect of the invention the gaseous phase can include one or more dopant gases. The dopant gases are selected according to the conductivity type desired for the doped material. Suitable gases for doping include phosphine and diborane, according to whether the conductivity type is n or p.

In accordance with yet another aspect of the invention, the gaseous phase includes an inert gas carrier. Suitable inert gas carriers are argon, helium and hydrogen. The gas phase material is advantageously decomposed on a heated substrate and the decomposition temperature is that of the substrate.

In accordance with still another aspect of the invention, amorphous semiconductive devices are prepared by forming a body through the pyrolytic decomposition of one or more gaseous phase polysemiconductanes and providing contacts for the body. The body is desirably formed on a substrate in one or more separate layers which can include dopants according to the conductivity type desired. Auxiliary layers, such as metal to form an interface and antireflection layers, can be included.

DESCRIPTION OF THE DRAWINGS

Other aspects of the invention will become apparent after considering several illustrative embodiments taken in conjunction with the drawings, in which.

DETAILED DESCRIPTION OF THE METHOD

Figure 1A:
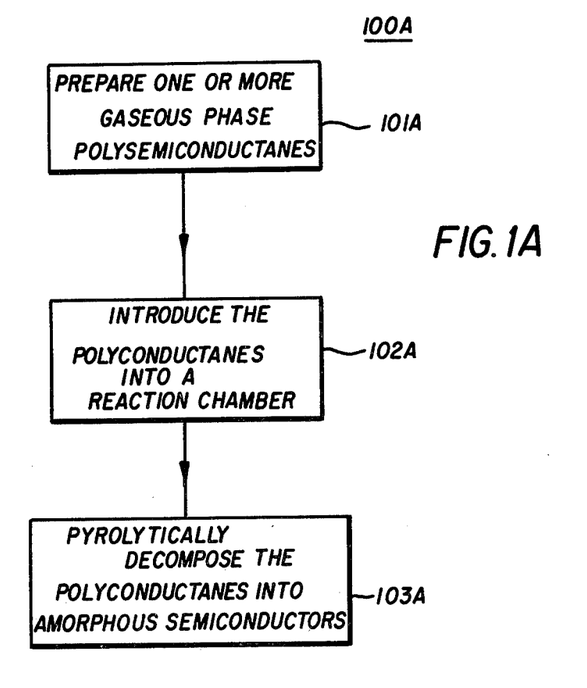
FIG. 1A is a flow chart of the method in accordance with the invention for preparing amorphous semiconductors.
Figure 1B:
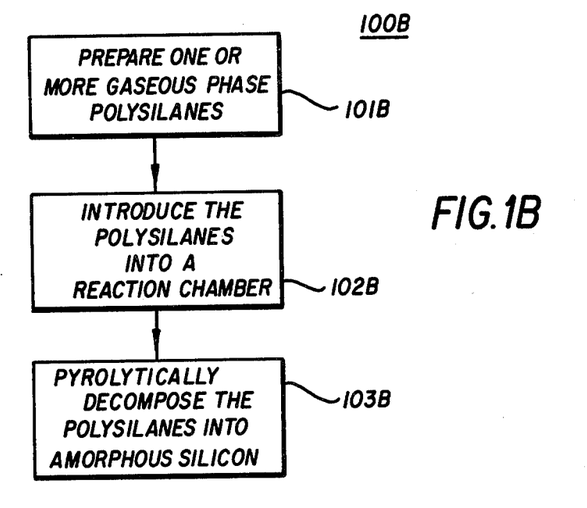
FIG. 1B is an adaptation of the flow chart of FIG. 1A showing the method of preparing amorphous silicons.

With reference to the drawings, FIG. 1A sets forth a flow chart 100A for the general practice of the invention, while FIG. 1B provides a flow chart 100B for the particular preparation of amorphous silicons having the special properties provided in accordance with the invention.

As illustrated in FIG. 1A, by process block 101A, the process begins with the preparation of one or more gaseous phase polysemiconductanes. The polysemiconductanes are to be distinguished from monosemiconductanes in which the semiconductor element, such as germanium, appears as a single atoms. In polysemiconductanes, the semiconductor appears in multiple atomic form. Semiconductanes for the practice of the invention are selected from Group IV of the Periodic Chart and thus can include germanium, or tin, and from Group VI of the Periodic Chart and thus can include selenium and tellurium. As noted below, a particularly preferred semiconductor is silicon.

Once the polysemiconductanes are prepared in a manner described in greater detail below, they are introduced into a reaction chamber illustrated in process block 102A. While in the chamber the polysemiconductanes are pyrolytically decomposed as represented in process block 103A. Pyrolytic decomposition involves the effect of heat at a suitable temperature on the gaseous material under consideration in converting the material into an amorphous semiconductor on the surface of the desired substrate.

It is to be noted that by contrast with the prior art, the polysemiconductanes produced by pyrolytic decomposition do not display the hydrogen defect characteristic commonly found in the production of amorphous semiconductors from monosemiconductanes. As a result it is not necessary to subject the resultant product to hydrogen ion implantation or heavy doping.

In particular, the invention is suitable for the production of amorphous silicon in accordance with the flow chart 100B of FIG. 1B. In this process the polysemiconductanes take the form of polysilanes in accordance with process block 101B. Once produced, the polysilanes are introduced into a reaction chamber pursuant to process block 102B. While in the chamber the polysilanes are subjected to heating in accordance with process block 103B. This decomposes them into amorphous silicon. The material is prepared under homogeneous, controllable conditions at temperatures substantially less than necessary to decompose monosilanes. In addition, the amorphous silicon product resulting from the decomposition of polysilanes does not require subsequent treatment to compensate for hydrogen deficiencies. As in the case of semiconductors prepared in accordance with the flow chart of FIG. 1A, the amorphous silicon produced in accordance with FIG. 1B is generally useful in a wide variety of semiconductor devices. In the general case, amorphous semiconductors produced in accordance with the invention can be substituted for semiconductors produced in other ways in a wide variety of semiconductive devices. This is particularly true of photovoltaic, photoconductive and current rectification devices. The invention also provides thicker and damage resistant layers which enhance photoconductive and photovoltaic properties.

In the case of polysilanes, useful members include disilanes, trisilanes, tetrasilanes, pentasilanes, and hexasilanes. Isomeric members of the family are also suitable. The only limit to the class of useful members is governed by the stability of the polysilane involved in the desired reaction. As the order of polysilanes increases there is a reduction in overall stability but this usually can be compensated by suitable operating conditions.

In order to produce consistent results it is desirable for the pyrolytic decomposition to take place under heterogeneous gas phase conditions at the substrate. The materials produced under homogeneous conditions at the substrate tend to differ according to the particular set of conditions employed, but are nevertheless useful in many applications.

Polysilanes that are decomposed pyrolytically may take the form of a mixture of polysilanes or be provided by a single polysilane alone. In addition, as long as there is at least one polysilane present, the gaseous mixture may include a monosilane. This has the effect of reducing the gaseous phase partial pressure so that operating conditions have to be adjusted accordingly.

The gaseous mixture may further include dopants and inert gaseous carriers. Good quality amorphous silicon layers have been produced using a gaseous phase of about 30 percent disilane with about 10 percent trisilane. The mixture also included about 50 percent monosilane and the remaining 10 percent was variously formed by other higher silanes, dopants and inert gas carriers.

A suitable operating pressure is about one atmosphere, but lower pressures may be employed as low as down to the pressure of about one Torr. The pressure desirably lies in the range from about one Torr to about 100 Torr in order to limit the gaseous phase nucleation of particles.

A suitable operating temperature is in the range from about 300° C. to about 500° C. A particularly suitable range of temperature is from about 350° C. to about 450° C. When the gas phase mixture is passed over a substrate that is heated to one of the foregoing temperatures, or when the temperature is varied in at least a part of one of the foregoing ranges, a high quality film of amorphous silicon results on the substrate. A particularly high quality film is produced when monosilane is removed at least in part from the gas phase mixture. While levels of monosilane as low as 5 percent produce suitable results, the monosilane may be completely eliminated from the gas phase mixture. With monosilanes removed, the reaction rate to produce an amorphous silicon film with a thickness in the range from about one-half to one micron is on the order of five minutes. When the amount of monosilane in the mixture is as high as 50 percent, the reaction rate to produce the same film thickness is on the order of about four hours.

Very high order silanes, for example beyond hexasilane, have little effect on the production of the desired amorphous silicon film at standard temperatures and pressures because they have negligible vapor pressures at room temperatures. However, when the higher order silanes are heated to produce a significant vapor pressure, for example, above one millimeter of mercury, they also can provide high quality amorphous silicon film.

Figure 2A:
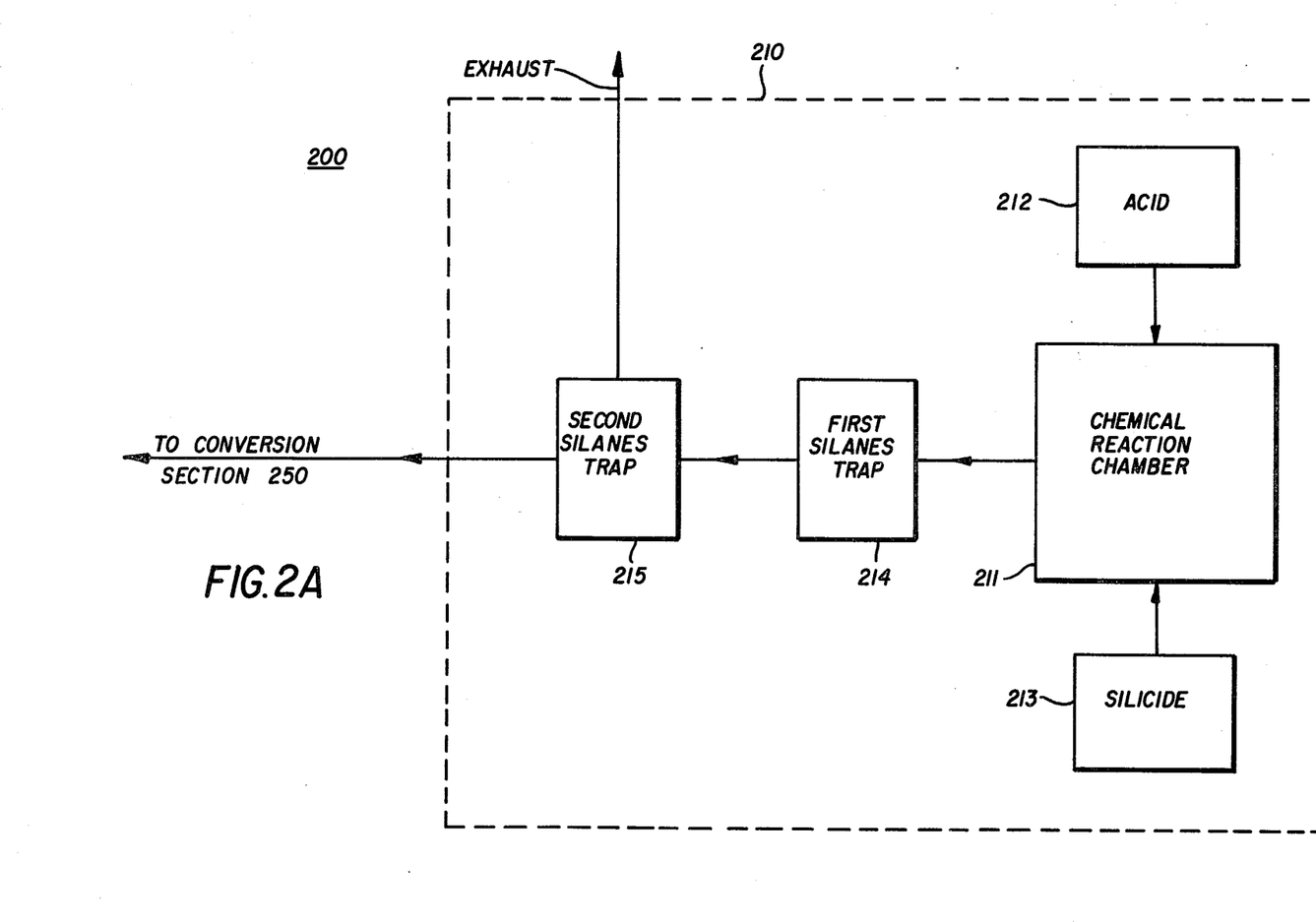
FIG. 2A is a schematic diagram of an illustrative arrangement for the production of suitable semiconductanes.
Figure 2B:
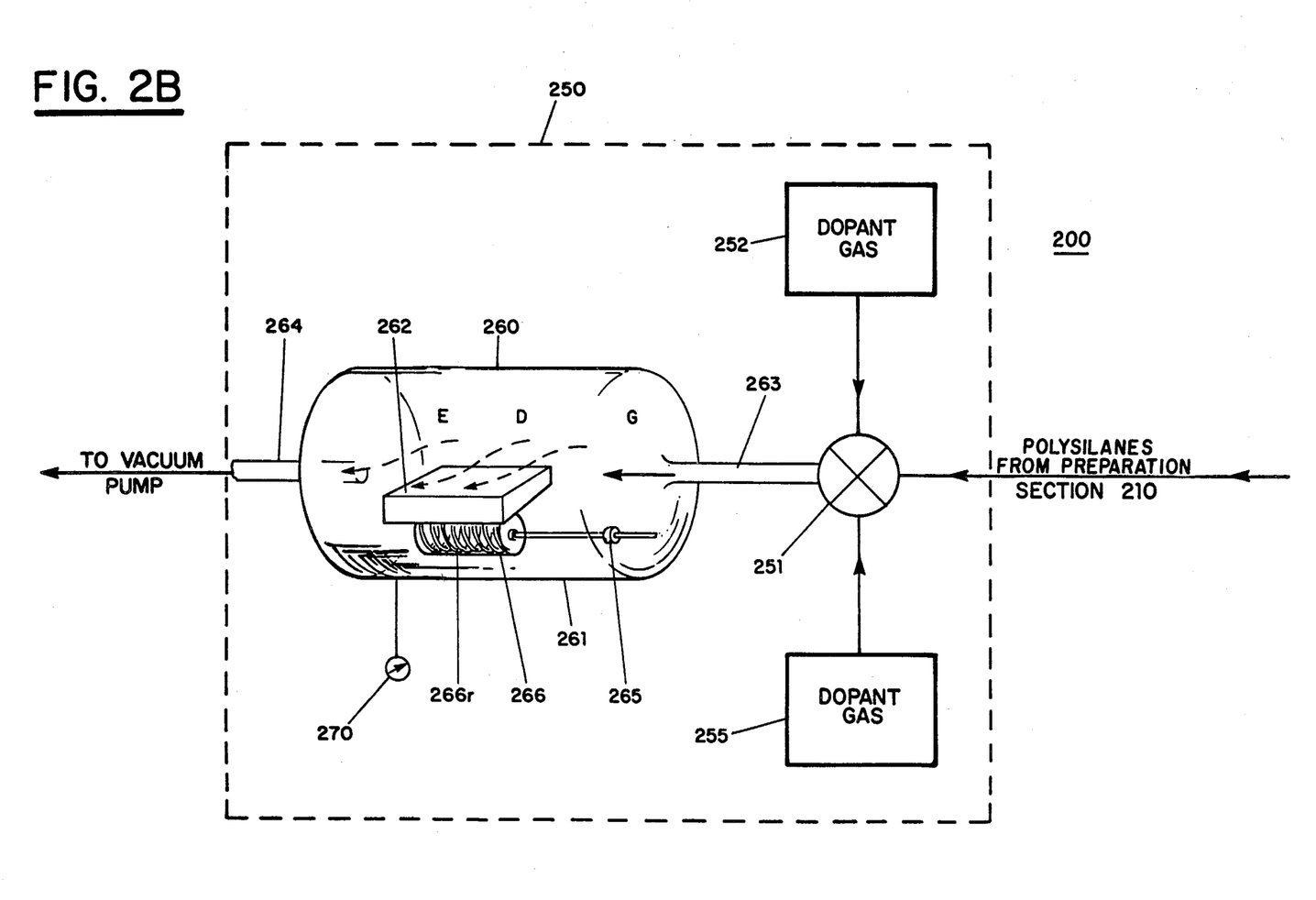
FIG. 2B is a schematic diagram of an illustrative reaction chamber for preparing amorphous semiconductors in accordance with the invention.

An illustrative arrangement for preparing amorphous semiconductors in accordance with the invention is illustrated in FIG. 2. The arrangement 200 is in two sections, 210 for the production of suitable semiconductanes and 250 for the conversion of the semiconductanes to the desired amorphous semiconductors. The arrangement 200 is specifically adapted for the production of amorphous silicons by pyrolytic decomposition, but it will be understood that appropriate modifications may be made for the production of other amorphous semiconductors.

The production section 210 includes a chemical reaction chamber 211 to which is applied a suitable acid from a source 212 and a silicide from a source 213. The reaction of the silicide, for example magnesium silicide, with the acid, for example hydrochloric, produces the desired higher order silanes. In particular, magnesium silicide is added to a 15 percent aqueous solution of hydrogen chloride to produce an exothermic reaction. This kind of reaction has been reported by Stock and Somieski in Chem. Ber. 49, 111, (1916). In this reaction approximately 25 percent of the silicide is converted to a mixture of silanes.

After the silane mix has been produced in the reaction chamber 211 it is applied to a series of traps 214 to exclude the silanes that are not desired for the pyrolytic decomposition which follows.

Monosilane and water are illustratively removed by passing the reaction products with a suitable inert gas carrier through various cold traps. Thus a mixture of solid and liquid toluene trap operating at $-96°$ C. is used to remove water vapor and high order silanes above the desired silane level. In order to assure the selection of the desired high order silanes, a further trap 215 is included making use of a mixture of solid and liquid pentane at $-134°$ C. The only material passing through the trap 215 is monosilane and hydrogen.

It will be understood that in some cases the entire gas phase mixture produced in the reaction chamber 211 can be applied directly to the conversion section 250.

In the illustrative conversion section 250, reactants, including the selected polysilanes, are applied to a reaction chamber 260 in the form of an envelope 261. The reaction chamber 260 illustratively contains a substrate 262 upon which amorphous silicon is to be deposited. The chamber 261 is of a material which will not contaminate the substrate 262. Suitable materials include quartz, glass, and stainless steel.

The illustrative reaction chamber 261 of FIG. 2 has an inlet 263 and an outlet 264. The inlet provides entry for selected polysilanes or a monosilane-polysilane mixture through a control valve 251 which allows the gaseous mixture to be supplemented by one or more dopant gases from sources 252 and 255. Positioned below the inlet 263 is a support 265 for a holder 266 of the substrate 262. The substrate holder 266 illustratively is a cartridge heater with a wound ceramic core and a ceramic binder encompassing a resistive element 266r. The latter is energized by suitable wiring which extends to the support along the holder. A stainless steel case isolates the ceramic core from the incoming gaseous stream represented by the arrow G. A manometer 270 is mounted on the chamber 261 to give an indication of the internal pressure. The temperature of the substrate 262 is monitored by a gauge (not shown) included in the wiring for the heater 266r. The substrate 262 is typically of glass.

In order to make the desired amorphous silicon deposit, the gaseous mixture G is passed over the substrate, being drawn toward the outlet 264 by the effect of a vacuum pump (not shown). The substrate 262 is operated at a temperature in the range from about 350° C. to 500° C., resulting in pyrolytic decomposition of at least a portion of the gaseous stream G. The decomposition components are indicated by the arrows D shown in dashed line form. The balance of the gaseous mixture, in the form of an exhaust E is drawn through the outlet 264.

As an alternative to the dynamic system described above, a static deposition system may also be used. In static deposition, the semiconductanes are introduced into the evacuated reactor through a valve. The exhaust and the inlet valves are then shut, causing a specified volume of gaseous mixture to be trapped in the chamber. Because of the heating effect of the coil, the trapped gas decomposes on both the wall of the reactor and the substrate. The result is a desired deposit of amorphous silicon on the substrate. The static system has the advantage of economizing on the volume and pumping of the gaseous medium.

The pressure within the chamber 261 is in the range from about one Torr to atmospheric. The Torr is a unit of pressure equal to about 1.333 millibars. It is the unit of pressure needed to support a column of mercury one millimeter in height under standard conditions.

As the pressure is reduced the deposition rate is correspondingly reduced. The critical pressure considered is the partial pressure of the silane mixture at the inlet. If the partial pressure is too high, namely over about 100 Torr, gas phase nucleation of particles takes place, producing a "shower" that results in a mixture of amorphous and crystalline silicon.

The properties of the deposited amorphous silicon can be controlled according to the amount of inert buffer gas accompanying the reactants, for example argon. The quantity of argon does not influence the partial pressure of the reactants so that it can be introduced at any suitable level, depending upon the desired modification in the properties.

In addition, the electrical properties of the deposited amorphous silicon are controlled according to the nature of the dopant gases from the sources 252 and 253. For p-type doping, the dopant gas 252 can be a boron hydride such as $B_2H_6$, $B_{10}H_{14}$, etc., while for n-type doping the dopant gas 255 is a phosphorus hydride such as $PH_3$ or $P_2H_4$. Alternatively, the desired dopant hydrides can be formed in the gas mixture by incorporating magnesium boride and/or magnesium phosphide in the reactants. It will be appreciated that any of a wide variety of other dopants may be used. In some cases it is desirable for the same dopant gas to be selectively applied from two or more separate sources such as the sources 252 and 255.

It is to be noted that the major portion of the gaseous mixture G desirably is of an inert carrier gas in order to inhibit spontaneous combustion of the reactants in the event of the fracture in the chamber 261. While the substrate 262 of FIG. 2 has been chosen as glass for reasons of economy, metal substrates, particularly steel, may also be employed.

For depositing amorphous germanium, digermane ($Ge_2H_6$) can be used and the deposition performed at a temperature in the range of 150° C. to 220° C. As an alternative to digermane, monogermane ($GeH_4$) can also be used, but the rate of deposition is somewhat slower than for digermane. Other higher germanes can also be used, such as trigermane ($Ge_3H_8$).

The practice of the invention is further illustrated with respect to the following nonlimiting examples.

EXAMPLE I

High order silanes prepared as heretofore described were pyrolytically decomposed on a substrate at a temperature of 390° C. and a pressure of 65 Torr. After two hours a film of amorphous silicon was deposited having a thickness of 3,600 Angstrom units.

EXAMPLE II

Example I was repeated except that the substrate temperature was increased to 410° C. The result after two hours of pyrolytic decomposition was a film having a thickness of 7,000 Angstrom units. The film was tested in the dark and found to have a resistance of 4.2 teraohms,, showing good insulative properties. The corresponding resistance under solar radiation of 70 milliwatts per square centimeter was 0.015 teraohms. These results indicated that the deposited material had a suitable photoresponsive effect.

EXAMPLE III

Example II was repeated except that the temperature was increased to 430° C. The resulting deposit had the same resistance under radiation but a reduced dark resistance of 2.8 teraohms.

EXAMPLE IV

Example I was repeated with the pressure increased to 100 Torr and the temperature increased by 10° C. to 400° C. The resulting deposit after two hours had a thickness of 11,000 Angstrom units. The radiation resistance was 0.0089 teraohms, and the dark resistance was 1 teraohms.

EXAMPLE V

Example IV was repeated with the temperature increased to 420° C. This produced an increased thickness of 13,000 Angstrom units and a reduced radiation resistance of 0.0015 teraohms, and a dark resistance of 0.2 teraohms.

EXAMPLE VI

Example I was repeated with a significant reduction in pressure to 10 Torr and an increase in temperature to 450° C. The result was a dramatic decrease in deposition time to 10 minutes, producing a thickness of 8,000 Angstrom units. This had an increased radiation resistance over Example V of 0.03 teraohms and an increased dark resistance of 7 teraohms.

EXAMPLE VII

Example VI was repeated with the pressure increased to 50 Torr, causing a slight increase in deposition time to 15 minutes for the same thickness of 8,000 Angstrom units. There was a slight increase in radiation resistance to 0.04 teraohms and a slight reduction in dark resistance to 1.5 teraohms.

EXAMPLE VIII

Example VII was repeated with a slight reduction in pressure to 35 Torr and a slight reduction in temperature to 410° C. One/mole percent phosphine ($PH_3$) was added to the higher order silane reactants, increasing the deposition time to 30 minutes and producing a radiation resistance of 0.006 teraohms and a dark resistance of 0.22 teraohms, indicating a semiconductor doping effect.

EXAMPLE IX

Example VIII was repeated with a reduction in pressure to 30 Torr and an increase in the dopant to 12/mole percent phosphine. The radiation resistance showed a significant reduction to 300 megohms and an approximately similar dark resistance of 340 megohms.

EXAMPLE X

Example VIII was repeated with an increase in dopant to 20/mol percent phosphine, producing a still greater reduction in radiation resistance than for Example IX. The measured values were 44 megohms for the radiation resistance and 47 megohms for dark resistance.

EXAMPLE XI

Example IX was repeated except that the temperature was increased to 450° C. and the additive was 60 percent hydrogen chloride. The result was a significant increase in radiation resistance to 0.1 teraohms and a corresponding dark resistance to 4 teraohms.

EXAMPLE XII

Example XI was repeated except that the pressure was reduced to 25 Torr and the additive was 1 percent hydrogen chloride. The deposition time was reduced to 10 minutes to produce a film having a radiation resistance of 0.03 teraohms and a dark resistance of 3 teraohms.

EXAMPLE XIII

Example XII was repeated except that the additive was increased to 20 percent hydrogen chloride. The deposition time was increased 20 minutes and the radiation resistance was increased slightly to 0.07 teraohms while the dark resistance was increased slightly to 4 teraohms.

EXAMPLE XIV

Example VII was repeated except that the gas mixture contained silane and higher silanes, including disilane and trisilane, and the deposition time was increased to 30 minutes. The thickness was 3,700 Angstrom units and the dark resistivity was 500 megohms ohm-cms, while the radiation (or light) resistance was 100 kilohms ohm-cms.

The results of the foregoing examples is summarized in TABLE I.

tion are different from the usual glow discharge and high vacuum deposited films. Films according to the present invention are not subjected to ion damage.

Figure 2C:
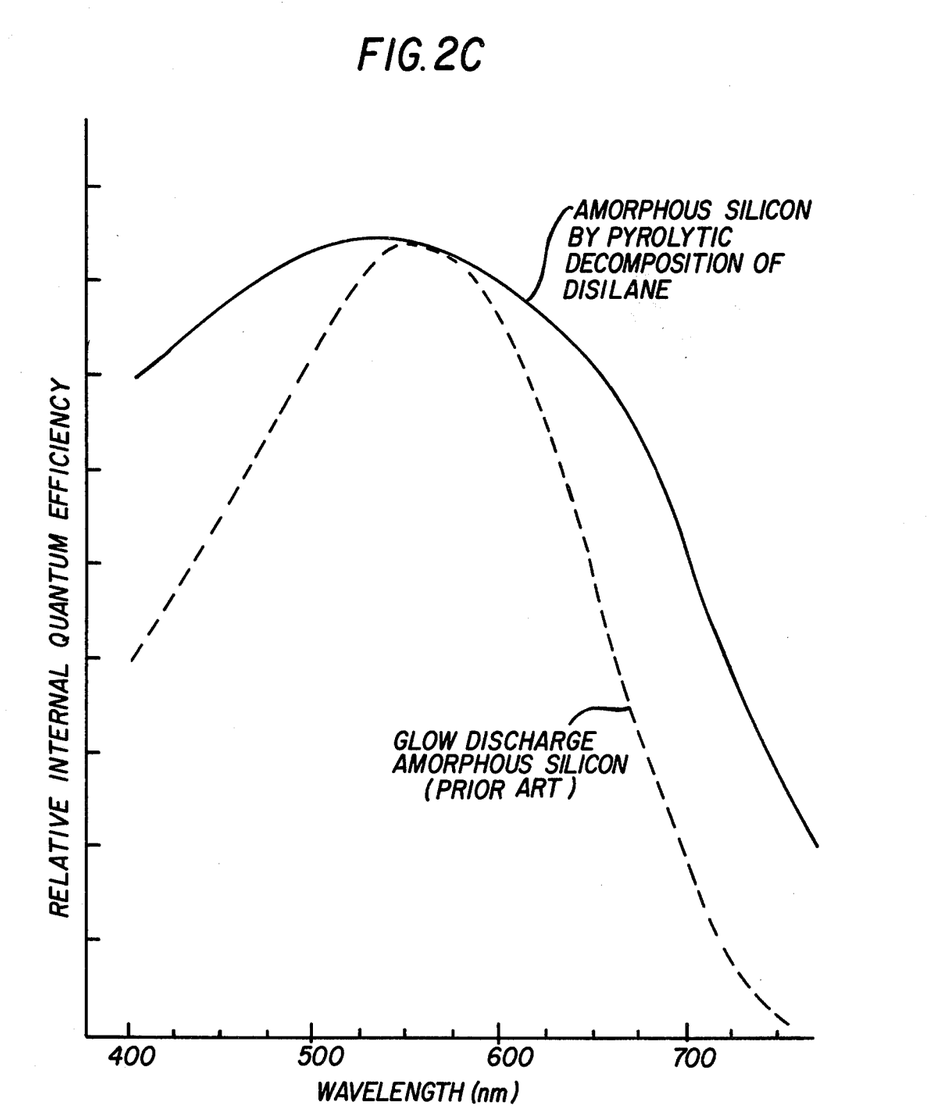
FIG. 2C is a graph of relative quantum efficiency against wavelength illustrating the difference between films produced in accordance with the invention and those produced by other techniques.

As an example of the different characteristics of the present films and those of the prior art, FIG. 2C compares the spectral response of a typical glow discharge film with a film according to the present invention. In the curves of FIG. 2C relative photovoltaic quantum efficiency is plotted against the wavelength of excitation radiation.

It is apparent from FIG. 2C that by contrast with glow discharge films, amorphous silicon films produced by the invention have a spectral response with higher relative quantum efficiencies, and extend to larger wavelengths.

In addition, by comparison with high vacuum deposited films, those of the invention achieve significantly higher photoconductivity, e.g. $10^{-6}$ to $10^{-4}$ ohms per centimeter (ohms-cm$^{-1}$), as opposed to a range of $10^{-9}$ to $10^{-7}$ ohms-cm$^{-1}$ for the high vacuum deposited films of U.S. Pat. Nos. 4,237,150 and 4,237,151.

Figure 3:
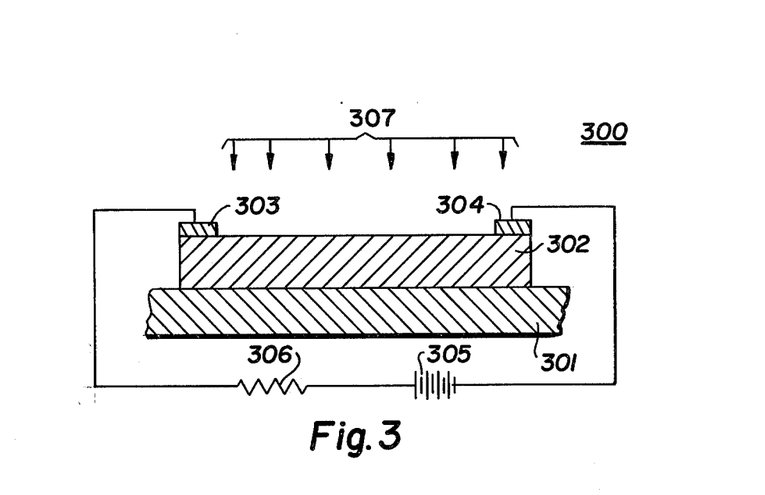
FIG. 3 is a schematic diagram of a photodetector prepared in accordance with the invention and associated circuitry.

One device of the invention is the photodector 300 of FIG. 3. A glass substrate 301 with an amorphous silicon deposit 302 is provided with aluminum contacts 303 and 304 and connected in circuit through a battery 305 to a load 306. When incident light 307 falls on the amorphous silicon layer 302, it creates electron-hole pairs which are acted upon by the voltage of the battery 305 and produce a corresponding voltage increase in the load 306 according to the number of hole-electron pairs created.

Figure 4:
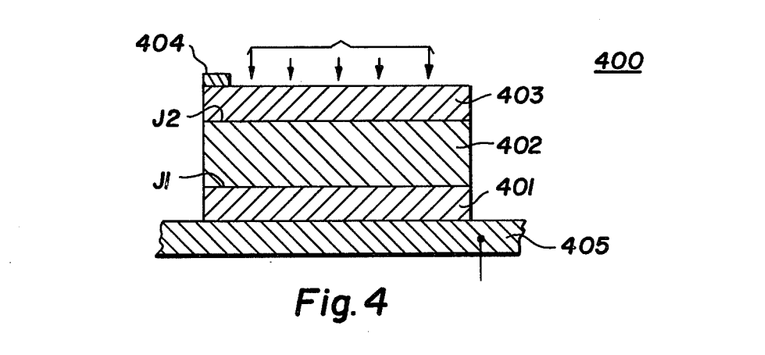
FIG. 4 is a schematic diagram of a heterojunction semiconductor device prepared in accordance with the invention.

Another device which makes use of amorphous silicon produced in accordance with the invention is the heterojunction semiconductor device 400 of FIG. 4. This device has different junctions J1 and J2 between p-type material 403 and intrinsic (i-type) material 402 on the one hand and between the intrinsic material 402 and the n-type semiconductor material 401 on the other hand. The bandgaps of the p- and n-type materials 403 and 401 are different than for the intrinsic material 402. Both the intrinsic material 402 and the n-type material 401 are formed by chemical vapor deposition. In the case of the n-type material a dopant such as phosphine is included. The p-type material 403 is also made by

TABLE I

| EXAMPLE | ADDITIVE (PERCENT) | PRESSURE (TORR) | TEMP. (°C.) | DEPOSITION TIME | THICKNESS (A°) | RADIATION RESISTANCE (OHMS)* OR RESISTIVITY (OHM-CMS) | DARK RESISTANCE (OHMS) OR RESISTIVITY (OHMS-CMS) |
|---|---|---|---|---|---|---|---|
| I | | 65 | 390 | 2 hrs. | 3,600 | | |
| II | | 65 | 410 | 2 hrs. | 7,000 | $1.5 \times 10^{10}$ OHMS | $4.2 \times 10^{12}$ |
| III | | 65 | 430 | 2 hrs. | 7,000 | $1.5 \times 10^{10}$ OHMS | $2.8 \times 10^{12}$ |
| IV | | 100 | 400 | 2 hrs. | 11,000 | $8.0 \times 10^{9}$ OHMS | $1.0 \times 10^{12}$ |
| V | | 100 | 420 | 2 hrs. | 13,000 | $1.5 \times 10^{9}$ OHMS | $2.0 \times 10^{12}$ |
| VI | | 10 | 450 | 10 min. | 8,000 | $3.0 \times 10^{10}$ OHMS | $7.0 \times 10^{12}$ |
| VII | | 50 | 450 | 15 min. | 8,000 | $4.0 \times 10^{10}$ OHMS | $1.5 \times 10^{12}$ |
| VIII | 1% pH$_3$ | 35 | 410 | 30 min. | 8,000 | $6.0 \times 10^{9}$ OHMS | $2.2 \times 10^{12}$ |
| IX | 12% pH$_3$ | 30 | 410 | 30 min. | 8,000 | $3.0 \times 10^{8}$ OHMS | $3.4 \times 10^{8}$ |
| X | 20% pH$_3$ | 35 | 410 | 30 min. | 8,000 | $4.4 \times 10^{7}$ OHMS | $4.7 \times 10^{7}$ |
| XI | 60% HCl | 30 | 450 | 25 min. | 8,000 | $1.0 \times 10^{11}$ OHMS | $4.0 \times 10^{12}$ |
| XII | 1% HCl | 25 | 450 | 10 min. | 8,000 | $3.0 \times 10^{10}$ OHMS | $3.0 \times 10^{12}$ |
| XIII | 20% HCl | 25 | 450 | 20 min. | 8,000 | $7.0 \times 10^{10}$ OHMS | $4.0 \times 10^{12}$ |
| XIV | | 50 | 450 | 30 min. | 3,700 | $1.0 \times 10^{5}$ OHMS-CMS | $5.0 \times 10^{8}$ OHMS-CMS |

*Under 70 mw/cm$^2$

DETAILED DESCRIPTION OF DEVICES

Amorphous semiconductors produced in accordance with the invention can be used to form a wide variety of semiconductor devices. It is important to note that the amorphous silicon films produced by the present invention chemical vapor deposition with a suitable dopant, for example boron. In addition, the p-type material gaseous stream includes methane or acetylene in order to produce a silicon carbon alloy (a—(Si,C):H).

The resultant device 400 is a P-I-N semiconductor device having a grid contact 404 and deposited desirably upon a substrate 405. The device 400 has the advantage over other similar devices of permitting a greater amount of light to enter the intrinsic layer 402 by virtue of the amorphous silicon carbon alloy layer 401, which has a higher bandgap than the intrinsic layer 402.

In general, desirable semiconductive devices can be produced by substituting semiconductor layers prepared in accordance with the invention for semiconductor layers prepared by other techniques. For example, the various devices of illustrative U.S. Pat. No. 4,064,521 can be adapted in accordance with the present invention by substituting pyrolytically decomposed polysemiconductanes for the glow discharge amorphous silicons of the prior art.

Figure 5:
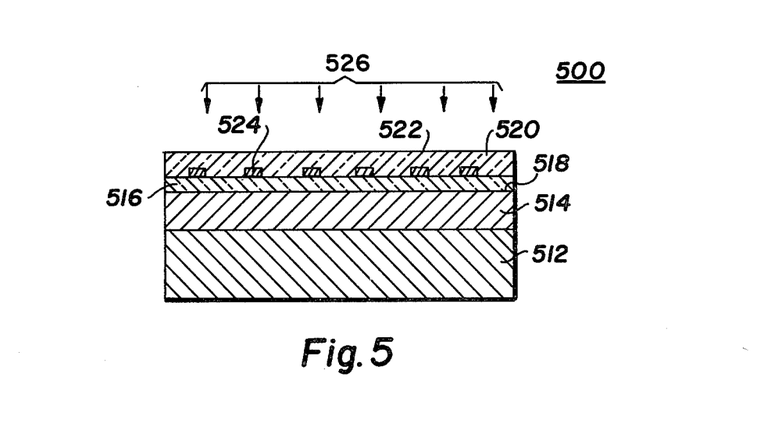
FIG. 5 is a cross sectional view of a Schottky barrier photovoltaic device prepared in accordance with the invention.

One such device is the Schottky barrier solar cell 500 of FIG. 5. This photovoltaic device 500 includes a substrate 512 of material having good electrical conductivity and suitable ohmic contact with amorphous silicon deposited thereon by pyrolytic decomposition in accordance with the invention. The solar cell 500 includes a metallic layer 516, an interface 518, and antireflection layer 520, an incident surface 522 and a grid electrode 524.

Generally a low work function metal will provide ohmic contact. Typically, the substrate 512 will be of a metal such as aluminum, niobium, tantalum, chromium, bismuth, antimony, stainless steel, or highly doped n-type single crystal or polycrystalline silicon. On a surface of the substrate 512 is a body 514 of amorphous silicon.

With respect to the semiconductor devices of the present invention, the depletion region or space charge region of the device will extend across part or all of the semiconductor body. Specifically, for photovoltaic devices the semiconductor body is also that portion of the device in which carriers can be generated for collection as current from the device.

The amorphous silicon of the body 514, fabricated in accordance with the invention posesses characteristics ideally suited for a photovoltaic device. Electron life time in the amorphous silicon so fabricated can be on the order of $10^{-7}$ seconds or greater, while electron lifetime in amorphous silicon formed by sputtering or evaporation is in the order of $10^{-11}$ seconds.

Also, measurements of the spectral response of the device of the present invention indicate a high collection efficiency through the visible portion of the spectrum, e.g., the average collection efficiency in the spectral range of 4,000 A to 7,000 A is on the order of 50 percent. The optical absorption of amorphous silicon is superior to that of single crystalline silicon over the visible light range, i.e., 4,000 A to 7,000 A.

Amorphous silicon has a larger absorption coefficient over the visible range than single crystalline silicon. This means that the body 514 of amorphous silicon in FIG. 5 can be a factor of 10 thinner than single crystal silicon and provide comparable light absorption in the visible range. This is the reason for the body 514 being as thin or thinner than one micron, while still providing good device efficiency.

Furthermore, the average density of localized states in the energy gap of glow discharge amorphous silicon is on the order of $10^{17}/cm^3$ or less. The average density of localized states of the CVD amorphous silicon prepared from $Si_nH_{2n+2}$ (n=2-6) is believed to be or deduced to be from device performance to be in the $10^{16}/cm^3$–$10^{17}/cm^3$ range, and much lower than that of amorphous silicon fabricated by other means, i.e., for sputtered or evaporated amorphous silicon the average density of localized states is $10^{19}$ cm/$^3$ or greater. One significance of the average density of localized states in the energy gap is that it is inversely proportion to the square of the width of the depletion region. Since density of states in the energy gap of amorphous silicon films prepared by the chemical vapor deposition of $Si_nH_{2n+2}$ (where n equals 2 through 6) is relatively low, a depletion width on the order of one micron can be obtained. Also signficant is the fact that carrier lifetime is inversely proportional to the average density of states near mid-gap, and is expected to high in CVD a-Si.

Figure 6:
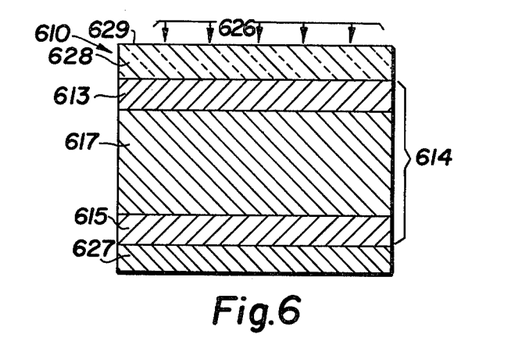
FIG. 6 is a cross sectional view of a P-I-N photovoltaic device prepared in accordance with the invention.

Referring to FIG. 6, another embodiment of the semiconductor device of the present invention is designated as 610. For the purpose of describing the present invention, the semiconductor device 610 is a photovoltaic device and more particularly a PIN solar cell. The photovoltaic device 610 includes a body 614 of amorphous silicon fabricated by the chemical vapor deposition process in accordance with the invention. The body 614 includes a first doped layer 613, a second doped layer 615 spaced from and opposite the first doped layer 613, and an intrinsic layer 617 in contact with and between the first and second doped layers 613 and 615. The intrinsic layer 617 is undoped but is usually slightly n-type. The first and second doped layers 613 and 615 are of opposite conductivity types. For purposes of discussion, the second doped layer 615 is of n-type conductivity while the first doped layer 613 is of p-type conductivity. Both the first and second layers 613 and 615 are of a high doping concentration, i.e., greater than $10^{18}/cm^3$ of electrically active dopants. Typically the n-type second doped layer 615 is doped with phosphorus and the p-type first layer 613 is doped with boron.

A solar radiation transmissive electrode 628 is on a surface of the first doped layer 613 opposite the second doped layer 615. The transmissive electrode 628 has an incident surface 629 opposite the first doped layer 613. The function of the transmissive electrode 628 is to be either transparent or semitransparent to solar radiation and be able to collect current generated in the body 614. Solar radiation 626 enters the device 610 at the incident surface 629. The solar radiation transmissive electrode 628 may be a single layer of a material such as indium tin oxide or tin oxide which are both transparent to solar radiation and have good electrical conductivity. Also the transmissive electrode 628 can be a thin film metal, i.e., about 100 A in thick ness, such as chromium, antimony, palladium or platinum, which will be semitransparent to solar radiation. If the transmissive electrode 628 is of a thin film metal, it is preferable that an antireflection layer, as described in FIG. 5, be on the incident surface 629 of the electrode 628 to decrease reflection of the solar radiation 626. Furthermore, the electrode 628 may be multilayered such as a layer of indium tin oxide on a layer of glass material. In such an instance the indium tin oxide is in intimate contact with the first doped layer 613.

If the surface resistivity of the electrode 628 at the first doped layer is on the order of about 10 ohms/□ or more, it is preferable to also have a grid contact like that described in FIG. 5, on the first doped layer 613 for collection of the current generated in the body 614.

An electrical contact 627 is on the surface of the second doped layer 615 opposite the transmissive electrode 628. The electrical contact 627 is of a material having reasonable electrical conductivity, such as aluminum, chromium, tantalum, antimony, niobium, or stainless steel.

As previously described in FIG. 5, the absorption coefficient of the amorphous silicon films prepared by the chemical vapor deposition of $Si_nH_{2n+2}$ (where n equals 2 through 6), is larger than that of single crystal silicon in the visible range. For this reason only a thin layer of amorphous silicon is needed for sufficient solar radiation absorption. Typically, the intrinsic region of amorphous silicon is about one micron or less in thickness, while the first and second doped layers 613 and 615 are each a few hundred Angstroms in thickness.

Well known to those of the PIN solar cell art is that as a result of the equalization in Fermi levels between layers 613, 615 and 617, there is a negative space charge in the second doped layer 615 and the formation of built-in potential between the layers 613 and 617, and 615 and 617 and also the formation of a depletion region in the intrinsic layer 617. How far the electric field of the depletion region extends into the intrinsic layer 617 is a function of the average density of localized states in the energy gap, as explained above, and the magnitude of the built-in potential. Also, from earlier discussion of semiconductor devices, it can be foreseen that the depletion region can extend across the entire thickness of the intrinsic layer 617, i.e., about one micron or less in thickness, as long as the built-in potential is sufficiently high. Therefore, any carriers generated in the intrinsic layer 617 by the absorption of solar radiation, will be swept up in the electric field of the depletion region and be collected as an electrical current.

It should be noted that dopants are provided by adding small quantities of dopant containing gases to the chemical vapor deposition stream, for example, for n-type doping, phosphine.

While phosphine and diborane were mentioned as the doping gases for the first and second doped layers 613 and 615, it is anticipated that other appropriate doping gases well known in the art can also be used.

The electrical contact 627 is then deposited on a surface of the second doped layer 615 by state of the art evaporation techniques. Final fabrication of the photovoltaic device 610 includes connecting contacting wires (not shown) to the contact 627 and electrode 628 for electrical connection to external circuitry.

Figure 7:
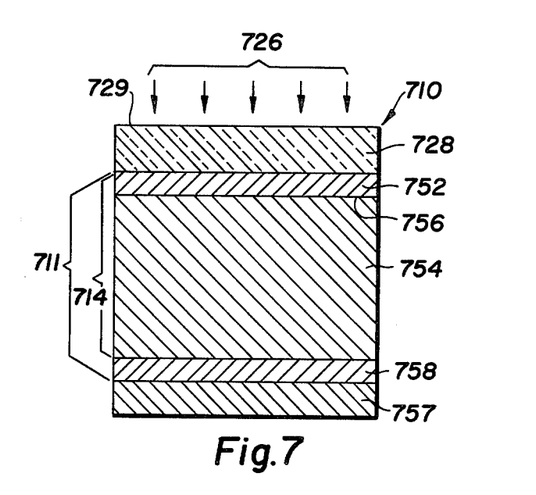
FIG. 7 is a cross sectional view of a P-N photovoltaic device prepared in accordance with the invention.

Referring to FIG. 7, the semiconductor device 710 is a photovoltaic device, and more particularly a P-N junction solar cell. The photovoltaic device 710 includes a region 711 of amorphous silicon fabricated by the polysilane chemical vapor deposition method in accordance with the invention, with appropriate doping gases. The region 711 comprises a first doped layer 752 of one conductivity type in contact with a second doped layer 754 of an opposite conductivity with a P-N junction 756 inbetween. For purposes of discussion, it is assumed that the first doped layer 752 is of p-type conductivity and the second doped layer 754 is of n-type conductivity. Both the first and second doped layers 752 and 754 form the body 714 of the photovoltaic device 710. The region 711 includes a third doped layer 758 on the surface of the second doped layer 754 opposite the P-N junction 756. The third doped layer 758 is of the same conductivity type as the second doped layer 754 but has a higher doping concentration than the second doped layer 754. Thus, the third doped layer 758 is of n-type conductivity. The third doped layer 758 assists in making ohmic contact to the body 714.

On a surface of the third doped layer 758 opposite the P-N junction 756 there is an electical contact 757, the same as the electrical contact 627 of FIG. 6. A solar radiation transmissive electrode 728 having a solar radiation incident surface 729 is on the surface of the first doped layer 752 opposite the P-N junction 756. Solar radiation 726 enters the device 710 at the incident surface 729. The solar radiation transmissive electrode 728 is the same as the solar radiation transmissive electrode 628 of FIG. 6.

In the operation of the photovoltaic device 710, solar radiation 726 enters the device 710 at the incident surface 729 and some of the solar radiation 726 is absorbed in the body 714, forming electron-hole pairs. These carriers then diffuse to the P-N junction 756 and if they arrive at the space charge region of the P-N junction 756 before recombining, they are collected and contribute to the current of the device 710.

In the fabrication of the device 710, as in the device 610 of FIG. 6, the transmissive electrode 728 is assumed to be a layer of indium tin oxide on a layer of glass material.

The electrical contact 757 is deposited on third doped layer 758 by state of the art evaporation techniques. The device 710 is completed by connecting contacting wires (not shown) to contact 757 and electrode 728. In the photovoltaic devices described previously the substrate 512 and electrical contacts 627 and 757 may reflect unabsorbed solar radiation back into the body 514, 614 and 714 respectively, thereby improving the possibility for solar absorption. It should be mentioned that in FIG. 5 of the present invention, the substrate 513 was described as a support for the device while in FIGS. 6 and 7, the light transmissive electrodes 628 and 728 are supports for their respective devices.

Although the embodiments described in FIGS. 5, 6 and 7 have been described as solar cells, it is anticipated by the present invention that these embodiments can also be utilized as high frequency photodetectors, i.e., devices which respond to radiant energy.

Figure 8:
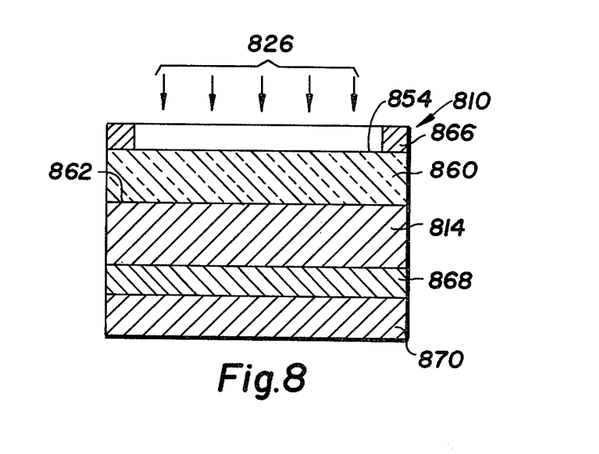
FIG. 8 is a cross sectional view of a further heterojunction photovoltaic device prepared in accordance with the invention.

Referring to FIG. 8, a further embodiment of the semiconductor device of the present invention is designated as 810. The semiconductor device 810 is described as a heterojunction photovoltaic device for the purpose of explaining the eighth embodiment of the present invention. The photovoltaic device 810 includes a body 814 of amorphous silicon fabricated by pyrolytic decomposition. The body 814 of amorphous silicon has the same characteristics as the body 402 of the second embodiment of the present invention.

On a surface of the body 814 is a semiconductor region 860. The semiconductor region 860 is of a different semiconductor material than that of the body 814 so as to form a heterojunction 862 in between. Both the body 814 and the semiconductor region 860 may be of the same conductivity type or of opposite conductivity type. The semiconductor region 860 has an incident surface 854 opposite the body 814. Solar radiation 826 is capable of impinging the device 810 at the incident surface 854. The body 860 is of a high bandgap semiconductor material, i.e. about 2.0 eV or greater, so as to be transparent or semitransparent to solar radiation 826 impinging the incident surface 864. As is well known in the art, the higher the bandgap of the semiconductor region 860, the less solar radiation 826 will be absorbed in the region 860. Also obvious to those skilled in the photovoltaic art is that it is desirable to have a large potential barrier in the vicinity of the heterojunction 862 for the generation of a large open circuit voltage. A potential barrier at the junction 862 is the result of properly matching the band structures of the semiconductor material of region 860 to the band structure of amorphous silicon of body 814 as to produce band bending at the heterojunction 862. Furthermore, the band structure of the semiconductor material of the region 860 should be chosen so that there is not a discontinuity, e.g. a spike, in the band structure at the heterojunction 862 that will trap photogenerated carriers. Typically, semiconductor materials which can be utilizied for the semiconductor region 860 are materials such as tin oxide, indium tin oxide, gallium arsenide, or single crystalline silicon.

On a portion of the incident surface 864 is a first electrode 866. The first electrode 866 is of a material such as a metal which will form a good electrical contact with the semiconductor region 860. As previously stated for the second embodiment of the present invention, it is desirable that the electrode 866 occupy a small amount of surface area on the incident surface 864. The first electrode 866 need only be on the peripherery of the incident surface 864 as shown if the semiconductor material of the semiconductor region 860 is highly doped so as to have a low sheet resistance, i.e. less than 10 ohms/□. If the sheet resistance of the semiconductor region 860 is greater than 10 ohms/□ then it may be necessary that the first electrode 866 be in the form of a grid or fingered structure.

There is a second reason why it is desirable to have the semiconductor region 860 highly doped. As is well known to those in the semiconductor art, the more highly doped is the semiconductor region 860, the less the electrical field generated by the potential barrier at the hetrojunction 862 will penetrate into the semiconductor region 860, and the farther it will penetrate into the body 814. Since it is desirable that region 860 be low in solar radiation absorption, an electric field within region 860 will do little to increase the amount of current generated from the device 810.

On a surface of the body 814 opposite semiconductor region 816 is an intermediate layer 868. The intermediate layer 868 is of the same conductivity type as the body 814 but of higher conductivity. On the intermediate layer 868 opposite the body 814 is a second electrode 870. The second electrode 870 is typically of a metal having good electrical properties.

The intermediate layer 868 is of a material which will make ohmic contact to the second electrode 870. Typically, the intermediate layer 868 will be of doped amorphous silicon alloy or a doped amorphous silicon.

These materials are fabricated as previously described. The intermediate layer 868 is of n type conductivity if the body 814 is slightly n type. It is desirable that the intermediate layer 868 be doped, i.e. to about 5 atomic percent, so as to provide an ohmic contact with second electrode 870. The intermediate layer 868 can be uniformly doped or the doping can be graded. With graded doping, the dopant concentration is highest at the interface of the intermediate layer 868 and second electrode 870 and is lowest at the interface of body 814 and intermediate layer 868.

As previously stated, if the semiconductor region 860 is highly doped, most of the space charge region, i.e., the depletion region, will be generated within the body 814 of amorphous silicon. Therefore, the solar radiation 826 which is absorbed within the depletion region in the body 814 and the small amount that is absorbed within the region 860 will generate electron-hole carriers which will be swept by the electrical field to either the first electrode 866 or the second electrode 870, thereby generating the electric current of the device 810. Outside the depletion region the photogenerated carriers must rely on diffusion to reach the junction. Furthermore, a graded doping concentration in the intermediate layer will generate an electric filed within the intermediate layer which will assist in collection of photogenerated carriers.

The fabrication of the photovoltaic device 810 is similar to that of the embodiments previously described. The semiconductor region 860 may function as the support in the conversion apparatus (as previously described in FIGS. 4 and 5) for the deposition of the body 814 of amorphous silicon. As an alternative method of fabrication, the body 814 can be formed by pyrolysis of disilane and the semiconductor region 860 can then be sputtered onto body 814. Next, the first electrode 866, the intermediate layer 868 and the second electrode 870 are formed by masking and evaporation techniques well known to those in the art.

While the further embodiment of the present invention has been described as a photovoltaic device, it is obvious to those skilled in the semiconductor art that such a device can also function as a rectifier. If the semiconductor device 810 were operated as a rectifier, there would be no need for the semiconductor region 860 being of a material which is semitransparent or transparent to solar radiation. In addition there would also be no need for an incident surface 864 which is capable of solar radiation impinging thereon.

While various aspects of the invention have been set forth by the drawings and specification, it is to be understood that the foregoing detailed descriptions are for illustration only and that various changes, as well as the substitution of equilavent constituents for those shown and described may be made without departing from the spirit and scope of the invention as set forth in the appended claims.

What is claimed is:

1. A method of preparing an amorphous semiconductor which comprises pyrolytically decomposing one or more gaseous phase polysemiconductanes at a temperature below about 500° C. and a partial pressure of said one or more polysemiconductanes in the range from above about 1 Torr to less than about 1 atmosphere.

2. The method of claim 1 wherein the pyrolytic decomposition takes place at a temperature in the range from about 300° C. to about 500° C.

3. The method of claim 2 wherein said temperature is in the range from about 350° C. to about 450° C.

4. The method of claim 1 wherein said partial pressure lies in the range from about one Torr to about 100 Torr, thereby to limit gas phase nucleation of particles.

5. The method of claim 1 wherein said polysemiconductanes are selected from the class ranging from disilanes to and including hexasilanes represented by the formula $Si_nH_{2n+2}$ where n ranges from two to six.

6. The method of claim 1 wherein said gaseous phase includes one or more dopant gases.

7. The method of claim 6 wherein said dopant gases are selected from the class including phosphorus and boron containing gases.

8. The method of claim 7 wherein said phosphorus containing gas is phosphine ($PH_3$) and said boron containing gas is diborane ($B_2H_6$).

* * * * *